United States Patent [19]

Cadieu

[11] Patent Number: 4,547,276
[45] Date of Patent: Oct. 15, 1985

[54] METHOD OF DIRECTLY CRYSTALLIZING A (Sm + Ti):Fe = 1:5 COMPOUND

[75] Inventor: Fred J. Cadieu, Flushing, N.Y.

[73] Assignee: The United States of America as represented by the Secretary of the Army, Washington, D.C.

[21] Appl. No.: 605,456

[22] Filed: Apr. 30, 1984

[51] Int. Cl.$^4$ .............................................. C23C 15/00
[52] U.S. Cl. ........................... 204/192 M; 204/192 R
[58] Field of Search ....................... 204/192 M, 192 R

[56] References Cited

U.S. PATENT DOCUMENTS 4,232,071 11/1980 Terada et al. ................... 204/192 M
4,347,086 8/1982 Chraplyvy et al. ............. 204/192 M

OTHER PUBLICATIONS

Theuerer et al., J. App. Physis, Jun., 1969, pp. 2994-2996.

*Primary Examiner*—Arthur P. Demers
*Attorney, Agent, or Firm*—Anthony T. Lane; Jeremiah G. Murray; Roy E. Gordon

[57] ABSTRACT

Samples of the Sm-Fe system are directly crystallized onto heated substrates by selectively thermalized sputtering with the addition of titanium as a stabilizing agent.

12 Claims, 5 Drawing Figures

METHOD OF DIRECTLY CRYSTALLIZING A (Sm+Ti):Fe=1:5 COMPOUND

The Government has rights in this invention pursuant to Contract No. DAAG29-80K-0094 awarded by the Department of Army.

This invention relates in general to a method of directly crystallizing samples of the Sm-Fe system onto heated substrates, and in particular to such a method wherein such samples are synthesized with the addition of titanium as a stabilizing agent. The Ti stabilizing agent acts to form a new composition of matter at a (Sm+Ti) to Fe atomic ratio of 1:5.

BACKGROUND OF THE INVENTION

Heretofore, Sm-Fe system compounds have not been of much technological interest. One reason has been that the Curie points are generally low. For example, $Sm_2Fe_{17}$ has a Curie point of approximately 122 C. In addition, $Sm_2Fe_{17}$ has a low anisotropy field and is an easy plane material unlike the easy axis $SmCo_5$ compound. A second reason is that there is no corresponding Fe compound to the technologically important $SmCo_5$ compound in the pure Sm-Fe system.

SUMMARY OF THE INVENTION

The general objet of this invention is to provide a method of directly crystallizing samples of the Sm-Fe system onto a substrate. A more particular object of the invention is to provide such a method of synthesizing a metastable phase at a composition corresponding to a (Sm+Ti) to Fe atomic ratio of 1:5. By metastable in this context is meant that the phase formed at a 1:5 atomic ratio is not present in the pure Sm-Fe system.

It has now been found that the aforementioned objectives can be attained by synthesizing by selectively thermalized sputtering onto heated substrates with the addition of Ti as a stabilizing agent. Room temperature intrinsic coercive forces of 6.2 kOe and static energy products of 5.5 MG-Oe have been obtained in this Ti stabilized (Sm+Ti):Fe 1:5 compound.

Samples of the (Sm+Ti):Fe=1:5 compound have been synthesized with the Ti to Fe atomic ratios spanning a range of from 1:99 to 1:5. The samples with varying Ti:Fe ratios differ in the observed coercive forces and in the Curie points of the (Sm+Ti):Fe=1:5 phase.

The use of selectively thermalized sputtering in which the sputtered atoms are thermalized to the substrate temperature as they arrive at the substrate allows a delicate and or metastable phase to be replicated by the subsequently arriving sputtered atoms. Films can be grown with and without the use of an applied magnetic field in the plane of the substrate during the sputter synthesis. The use of this inplane magnetic field during the sputter synthesis process introduces an inplane anisotropy only if used below the ferromagnetic Curie point. From this it is inferred that the Curie point of this new Ti stabilized (Sm+Ti):Fe=1:5 phase is greater than 600 C. Magnetic Field values of approximately 1.7 kOe and 2.5 kOe have been applied in the plane of the substrate while the samples are being synthesized onto substrates held at temperatures of approximately 600 C.

In carrying out the invention, samples are synthesized by sputtering from three colinear targets onto heated polished aluminum oxide substrates so that a narrow composition gradient is produced along the length of a substrate. Sufficiently high sputtering gas pressures are used so that the sputtered atoms are thermalized by collisions with the sputtered gas atoms as they arrive at the substrate. The samples are synthesized onto sufficiently heated substrates so that the deposit is directly crystallized upon deposition. No subsequent heat treatment or annealing is employed before the magnetic measurements are made.

Samples have also been synthesized onto heated polished aluminum oxide substrates in the presence of an inplanar magnetic field such that a single composition as near as possible to a (Sm+Ti):Fe=1:5 atomic ratio covers the entire substrate surface.

Figure 1:
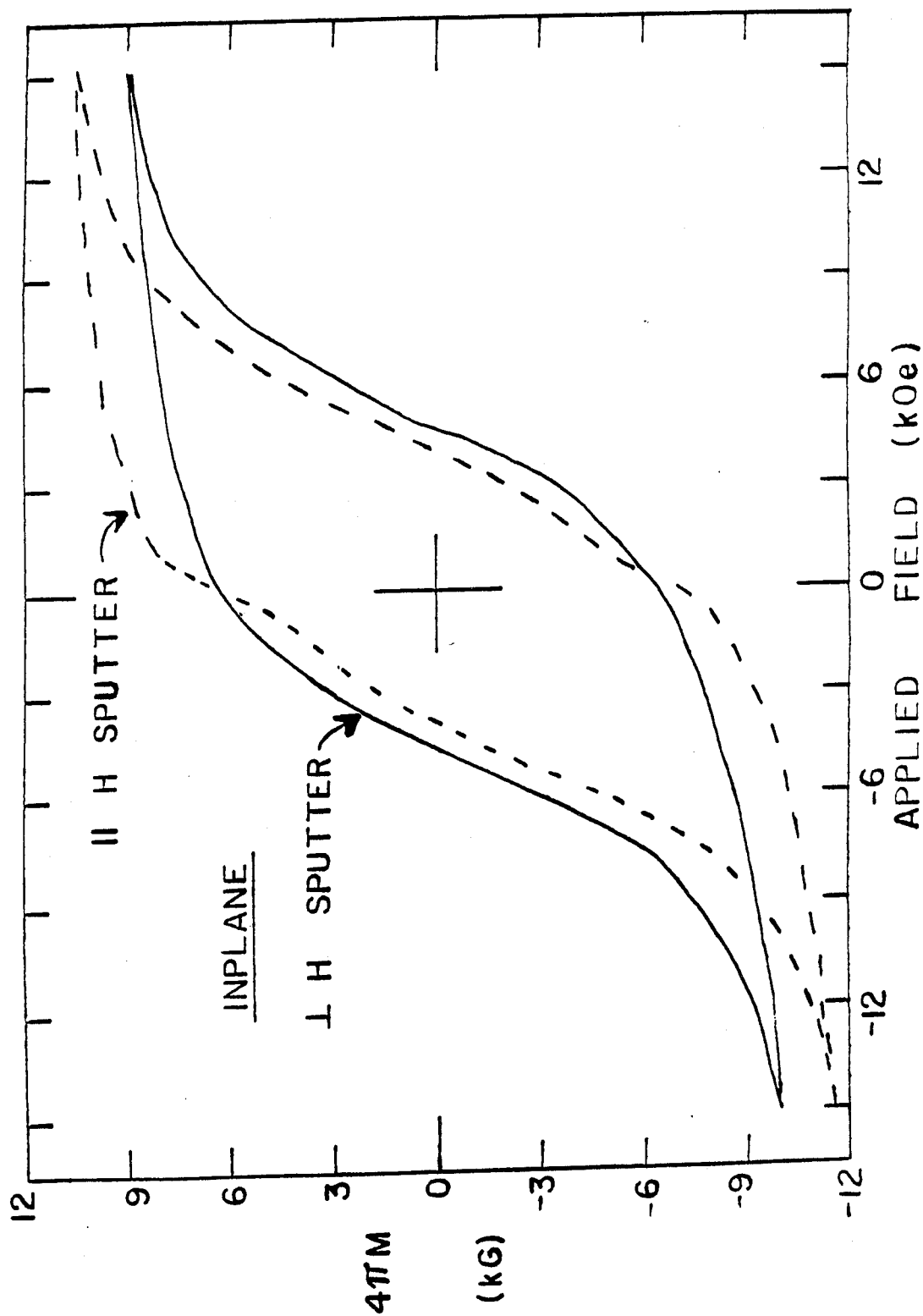
FIG. 1 shows inplane hysteresis loops at room temperature for a Sm,Ti,Fe (0.087,0.046,0.867) sample synthesized onto 600 C. substrates in the presence of inplane magnetic field, H sputter, of 1.75 kOe.

Referring to the drawing, in FIG. 1 are shown in the film plane hystersis loops from a Sm,Ti,Fe (0.087,0.046,0.867) sample for the case of the magnetometer field applied parallel and perpendicular to a field of 1.75 kOe applied inplane during the sputter synthesis. The field applied during sputtering has to a certain extent established a preferred direction within the film plane. The substrate temperature during synthesis was 600 C. and the sputtering gas pressure was 150 microns of Ar. The moment for 15 kOe applied inplane parallel to the field applied during sputtering rises to a higher value than for the magnetometer field applied perpendicular to H sputter. However, the hysteresis loops for the magnetometer field applied perpendicular to the sputtering field exhibits a higher coercive force and a smooth S loop. The intrinsic coercive force in this instance is 4.6 kOe.

Figure 2:
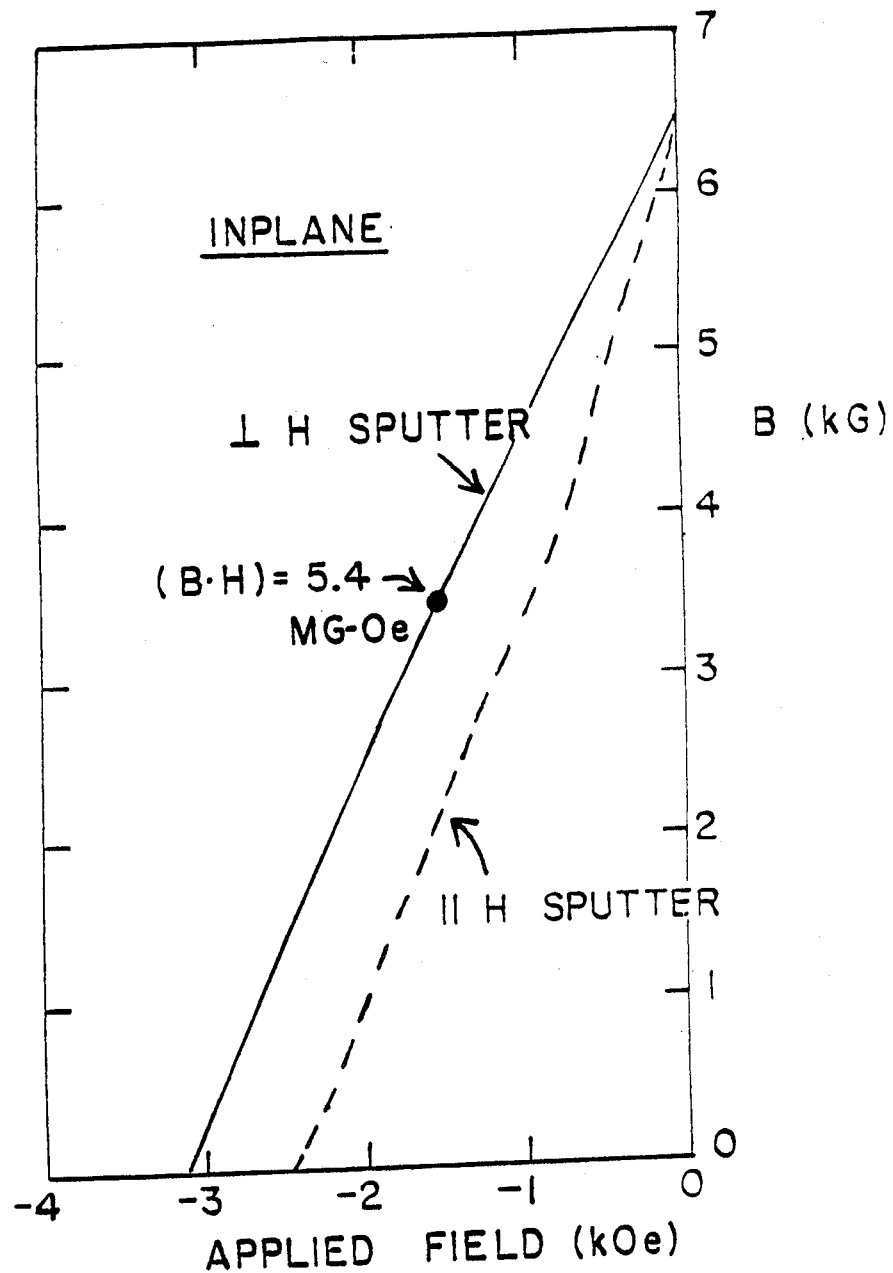
FIG. 2 shows inplane B versus H demagnetization curves for the sample of FIG. 1. The point of maximum energy product is indicated.

The inplane B field for the second quadrant demagnetization are shown in FIG. 2 for the loops of FIG. 1. Both of these curves are for the case of a film sample 1.67 microns thick by 5 mm square. Consequently an approximately zero demagnetization factor compared to $4\pi$ has been used in computing the B field. The inplane loop for the case of the magnetometer field applied perpendicular to H sputter is highly linear. The point of maximum static energy product is indicated in the figure at a value of 5.4 MG-Oe. The remanent moment for the inplane demagnetization parallel to H sputter falls faster and is not as linear.

The room temperature magnetic properties of a similarly prepared sample with a composition of Sm,Ti,Fe (0.075,0.092,0.833) have also been measured. This sample for the magnetometer field applied parallel to the field applied during the sputter synthesis had an intrinsic coercive force of 6.2 kOe and a static energy product of 5.5 MG-Oe. In this case the Ti to Fe atomic ratio equals 1:9.

Figure 3:
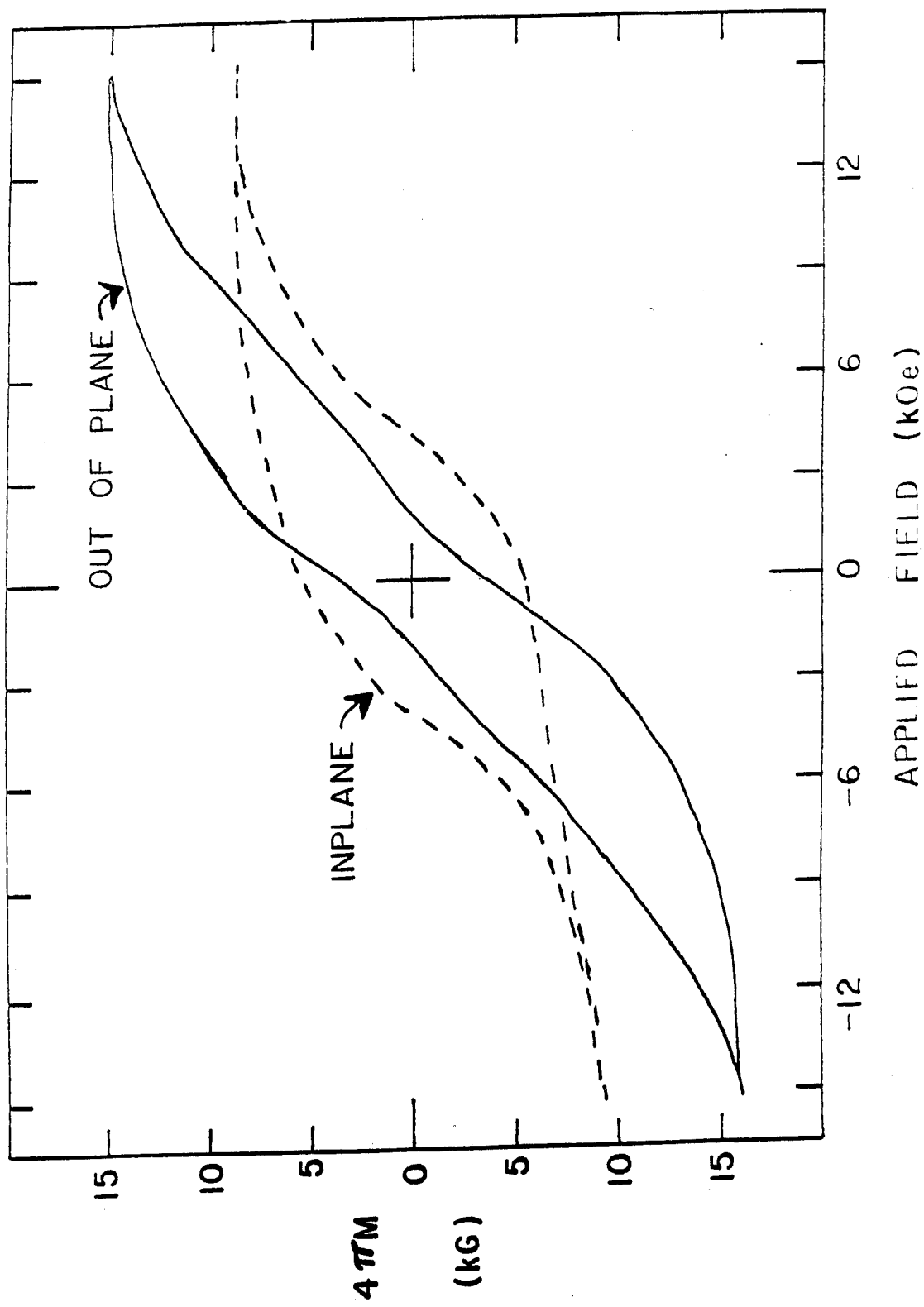
FIG. 3 shows hysteresis loops at room temperature for a Sm,Ti,Fe (0.095,0.046,0.860) sample synthesized onto 600 C. substrate. Loops for the magnetometer field perpendicular to film plane and for inplane parallel to H sputter are shown.

In FIG. 3 is shown hysteresis loops for a Sm,Ti,Fe (0.095,0.046,0.860) sample grown under the same conditions as used for the sample of FIG. 1. A loop for the magnetometer field inplane and parallel to H sputter and a loop for the magnetometer field applied perpendicular to the film plane is also shown. The output of plane moment at 15 kOe applied field is substantially larger at 15.3 kG than the corresponding inplane value of 9.7 kG. The inplane coercive force is 3.84 kOe for the sample which is slightly lower in Fe content than the sample of FIG. 1.

Figure 4:
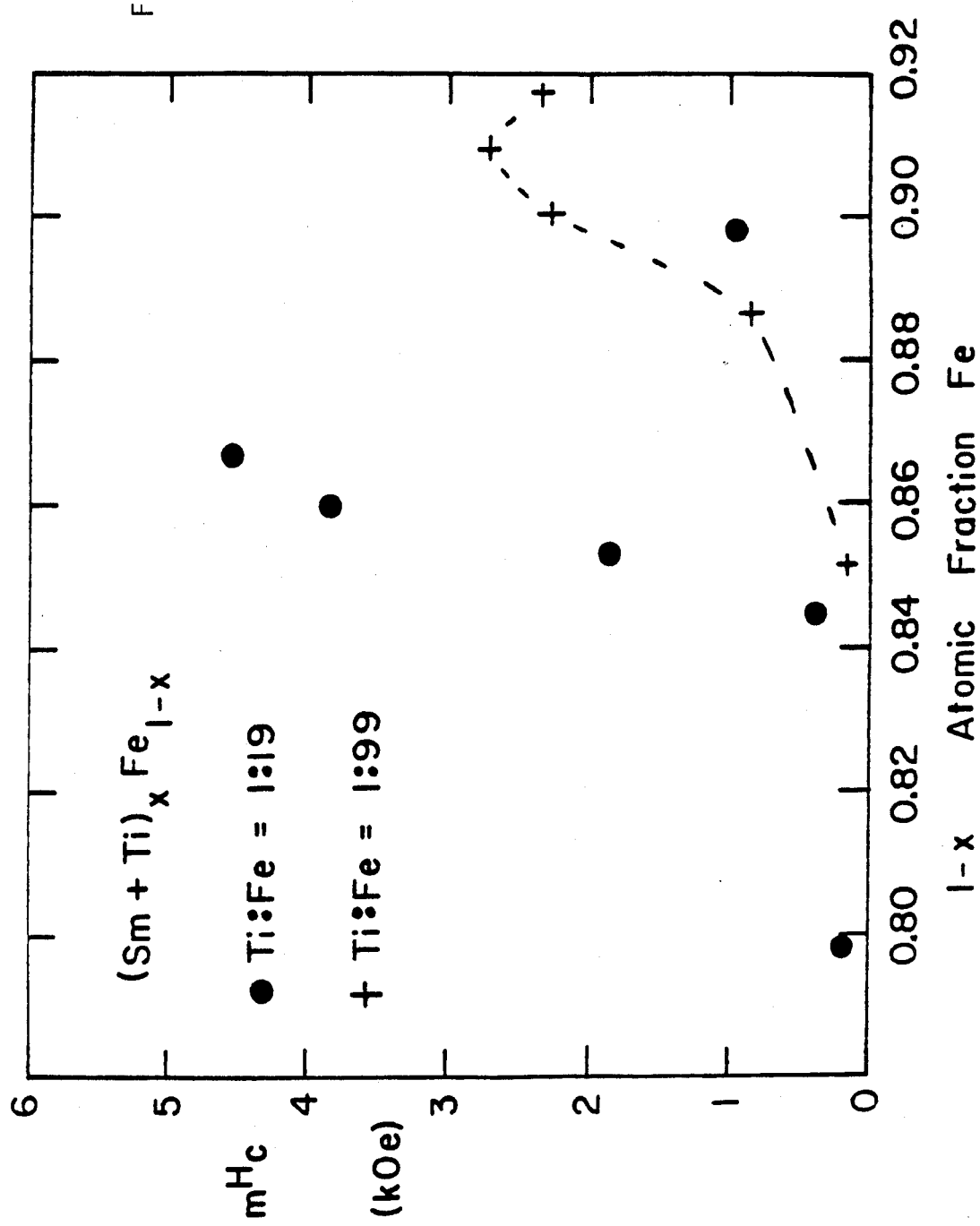
FIG. 4 shows room temperature intrinsic coercive forces for two Ti containing sets of samples versus total Fe atomic fraction.

In FIG. 4 are shown the inplane coercive forces for two sets of samples which have Ti:Fe atomic concentrations of 1:19 and of 1.99. The coercive forces as measured at room temperature peak sharply at different total atomic fractions of Fe. The samples for the Ti:Fe=1:19 reach a maximum of 4.6 kOe with an energy product of 5.4 MG-Oe. The samples for Ti:Fe=1:99 reach a maximum coercive force of 2.8 kOe with an energy product of 5.0 Mg-Oe. A sample with an Fe atomic fraction of 0.833 reached a maximum coercive force of 6.2 kOe. The absolute Fe fraction has a tolerance of ±0.010.

Figure 5:
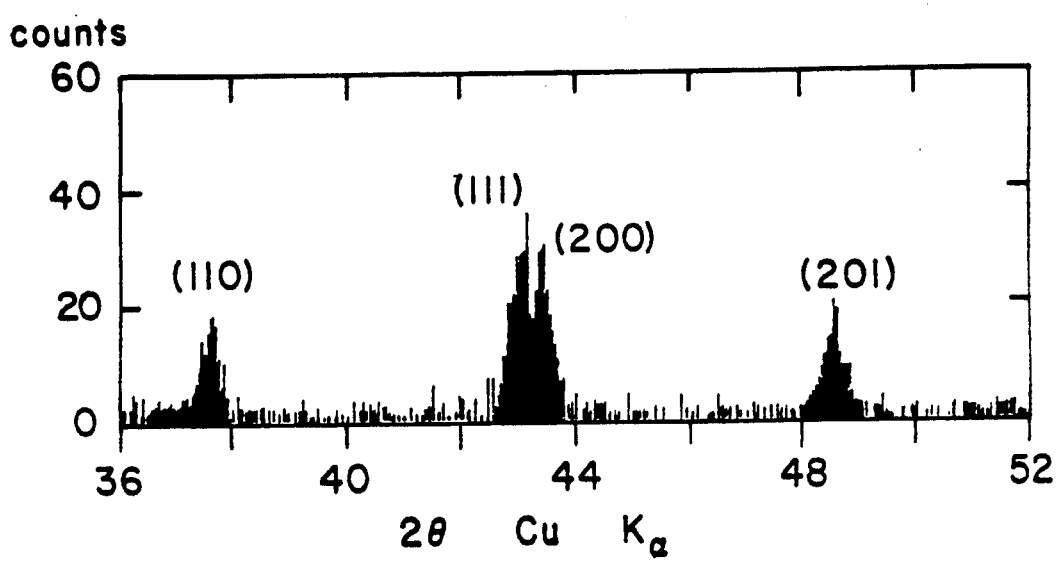
FIG. 5 shows X-ray diffraction of Ti stabilized (Sm+Ti):Fe=1:5 atomic ratio phase of FIG. 1, Cu K alpha, radiation in reflection.

The Ti:Fe=1:19 set of samples show three different x-ray types of diffraction patterns. The low coercive force samples from 0.79 to 0.85 Fe show one pattern. While from 0.85 to 0.87 these three samples show a different pattern. This is the high coercive force region. The samples at 0.89–0.90 is a 2–17 compound region. The x-ray pattern for the Ti:Fe=1:19 samples which exhibit a high coercive force is shown in FIG. 5. This pattern is indexed on the basis of a Ti stabilized SmFe$_5$ phase. The x-ray pattern for the Ti:Fe=1:99 high coercive force region shows a strong line at the position of the (201) line of FIG. 5 but also shows a weak line at 44.53 degrees which is ascribed to an iron separated phase. Thus in these 1:99 samples there is direct evidence that not all the Fe present is associated with the high coercive force phase.

I wish it to be understood that I do not desire to be limited to the exact details as described for obvious modifications will occur to a person skilled in the art.

What is claimed is:

1. Method of synthesizing a metastable crystal phase at a composition corresponding to a (Sm+Ti):Fe=1:5 atomic ratio, said method comprising synthesizing a film by selectively thermalized sputtering onto heated substrates with the addition of titanium as a stabilizing agent.

2. Method according to claim 1 wherein the film is about 2 to 4 microns in thickness.

3. Method according to claim 1 wherein the substrate temperature is about 600 C.

4. Method according to claim 1 wherein the synthesis is carried out in the presence of an inplane magnetic field.

5. Method according to claim 1 wherein the sputtering gas pressures employed have been sufficiently high so that the sputtered atoms have transferred excess energy and momentum to the sputtering gas atoms before their arrival at the substrate.

6. Method according to claim 1 wherein the substrate is a material which does not react with the film being deposited within the range of the substrate temperatures employed.

7. Method according to claim 6 wherein the substrate is polished polycrystalline aluminum oxide.

8. Method according to claim 1 wherein the synthesized film has an intrinsic coercive force greater than 2 kOe.

9. Method according to claim 1 wherein the synthesized film for a Ti:Fe=1:9 atomic ratio sample has a room temperature intrinsic coercive force of 6.2 kOe and a static energy product of 5.5 MG-Oe.

10. Method of synthesizing a film of Sm,Ti,Fe (0.087,0.046,0.867) atomic fractions comprising trisputtering the system using selective thermalization in the presence of an inplane magnetic field of 1.75 kOe onto a substrate at 600 C.

11. Method of synthesizing a film of Sm,Ti,Fe (0.095,0.046,0.860) atomic fractions comprising trisputtering the system using selective thermalization in the presence of an inplane magnetic field onto a substrate at 600 C.

12. Method of synthesizing a film of Sm,Ti,Fe wherein the entire substrate is covered by a uniform composition such that (Sm+Ti) to Fe ratio is approximately 1:5 comprising sputtering the system using selective thermalization in the presence of an inplane magnetic field onto a substrate at 600 C.

* * * * *